United States Patent
Wang et al.

(10) Patent No.: US 8,213,216 B2
(45) Date of Patent: Jul. 3, 2012

(54) SHARED BIT LINE AND SOURCE LINE RESISTIVE SENSE MEMORY STRUCTURE

(75) Inventors: Xuguang Wang, Eden Prairie, MN (US); Hai Li, Eden Prairie, MN (US); Hongyue Liu, Maple Grove, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/086,869

(22) Filed: Apr. 14, 2011

(65) Prior Publication Data

US 2011/0188301 A1    Aug. 4, 2011

Related U.S. Application Data

(63) Continuation of application No. 12/502,210, filed on Jul. 13, 2009, now Pat. No. 7,940,548.

(51) Int. Cl.
    *G11C 11/00* (2006.01)
(52) U.S. Cl. ........ 365/148; 365/100; 365/173; 365/135; 365/158; 365/196
(58) Field of Classification Search .................. 365/148, 365/100, 173, 145, 158, 196
    See application file for complete search history.

(56) References Cited

U.S. PATENT DOCUMENTS

| | | | |
|---|---|---|---|
| 5,554,874 A | 9/1996 | Doluca | |
| 5,867,443 A | 2/1999 | Linderman | |
| 7,009,877 B1 | 3/2006 | Huai | |
| 7,098,494 B2 | 8/2006 | Pakala | |
| 7,187,577 B1 | 3/2007 | Wang | |
| 7,224,601 B2 | 5/2007 | Panchula | |
| 7,272,034 B1 | 9/2007 | Chen | |
| 7,272,035 B1 | 9/2007 | Chen | |
| 7,282,755 B2 | 10/2007 | Pakala | |
| 7,286,395 B2 | 10/2007 | Chen | |
| 7,289,356 B2 | 10/2007 | Diao | |
| 7,345,912 B2 | 3/2008 | Luo | |
| 7,379,327 B2 | 5/2008 | Chen | |
| 7,502,249 B1 | 3/2009 | Ding | |
| 7,515,457 B2 | 4/2009 | Chen | |
| 2008/0273380 A1 | 11/2008 | Diao | |
| 2008/0310213 A1 | 12/2008 | Chen | |
| 2008/0310219 A1 | 12/2008 | Chen | |
| 2009/0040855 A1 | 2/2009 | Luo | |
| 2009/0185410 A1 | 7/2009 | Huai | |
| 2010/0110756 A1* | 5/2010 | Khoury et al. ................. 365/148 |

\* cited by examiner

*Primary Examiner* — Thong Q Le
(74) *Attorney, Agent, or Firm* — Mueting Raasch & Gebhardt

(57) ABSTRACT

A resistive sense memory apparatus includes a first semiconductor transistor having a first contact electrically connected to a first source line and a second contact electrically connected to a first resistive sense memory element and a second semiconductor transistor having a first contact electrically connected to a second source line and a second contact electrically connected to a second resistive sense memory element. A bit line is electrically connected to the first resistive sense memory element and the second resistive sense memory element.

20 Claims, 3 Drawing Sheets

SHARED BIT LINE AND SOURCE LINE RESISTIVE SENSE MEMORY STRUCTURE

RELATED APPLICATIONS

This application is a continuation of U.S. application Ser. No. 12/502,210 filed Jul. 13, 2009 and issued as U.S. Pat. No. 7,940,548 on May 10, 2011. The entire disclosure of this application is incorporated herein by reference.

BACKGROUND

Fast growth of the pervasive computing and handheld/communication industry has generated exploding demand for high capacity nonvolatile solid-state data storage devices. Current technology like flash memory has several drawbacks such as slow access speed, limited endurance, and the integration difficulty. Flash memory (NAND or NOR) also faces significant scaling problems.

Resistive sense memories are promising candidates for future nonvolatile and universal memory by storing data bits as either a high or low resistance state. One such memory, MRAM, features non-volatility, fast writing/reading speed, almost unlimited programming endurance and zero standby power. The basic component of MRAM is a magnetic tunneling junction (MTJ). MRAM switches the MTJ resistance by using a current induced magnetic field to switch the magnetization of MTJ. As the MTJ size shrinks, the switching magnetic field amplitude increases and the switching variation becomes more severe. Resistive RAM (RRAM), such as spin torque RAM, is another resistive sense memory that has a variable resistance layer that can switch between a high resistance state and a low resistance state (for example by the presence or absence of a conductive filament) by applicant of a current or voltage.

However, some yield-limiting factors must be overcome before resistive sense memory enters the production stage. One challenge is that the resistive sense memory element often requires a large current in order for writing to occur. In particular, each memory element of a resistive RAM array has its own bit line and source line. As the array size becomes larger, the voltage drop on the bit line and source line increases. Also, as the array density increases, the bit line width becomes narrower, further increasing the resistivity of the bit line and increasing the voltage drop on the bit line. There is a need for resistive sense memory array structures that improve array density and provide fast access speed.

BRIEF SUMMARY

The present disclosure relates to a resistive sense memory array structure that includes bit line and source line sharing. In particular, the present disclosure relates to resistive sense memory array structure that has a shared bit line and source line array structure and a biasing method for the same.

One illustrative resistive sense memory apparatus includes a resistive sense memory apparatus includes a first semiconductor transistor having a first contact electrically connected to a first source line and a second contact electrically connected to a first resistive sense memory element and a second semiconductor transistor having a first contact electrically connected to a second source line and a second contact electrically connected to a second resistive sense memory element. A bit line is electrically connected to the first resistive sense memory element and the second resistive sense memory element.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
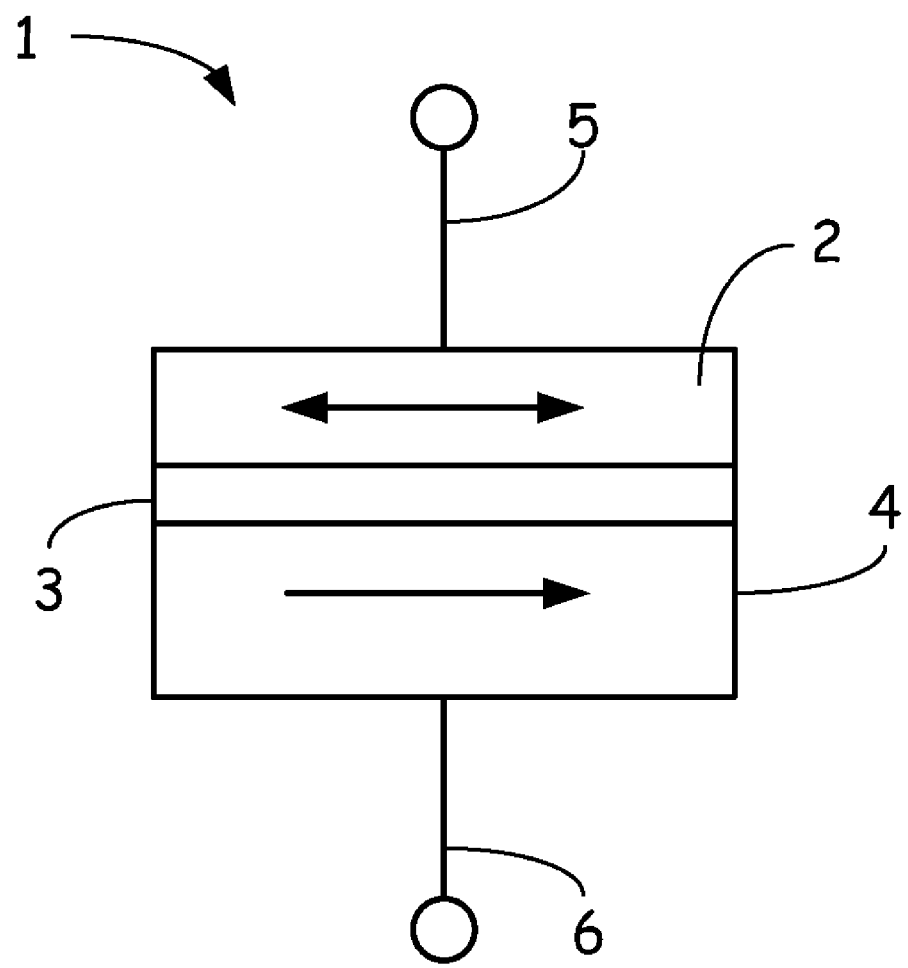
FIG. 1 is a cross-sectional schematic diagram of an illustrative magnetic tunnel junction data cell.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to a resistive sense memory array structure that includes bit line and source line sharing. In particular, the present disclosure relates to resistive sense memory array structure that has a shared bit line and source line array structure and a biasing method for the same. The shared bit line and source line resistive sense memory array structure can provide an array with higher density and faster access speed than conventional resistive sense memory array structures. In addition, a shared bit line can increase the width of the shared bit line reducing the bit line resistivity and allowing for further scaling of the apparatus. A method of accessing a single memory cell and avoiding sneaky pathways is also disclosed. While the present disclosure is not so limited, an appreciation of various aspects of the disclosure will be gained through a discussion of the examples provided below.

Variable resistive memory includes memory cells that switch between at least a low resistance data state and a high resistance data state by passing a write current through the resistive memory cell (i.e., resistive RAM or RRAM). In some embodiments the resistive memory cell is a phase change data cell (i.e., PCRAM) or a programmable metallization data cell (i.e., PMCRAM). In some embodiments the resistive memory is a magnetic tunnel junction such as, for example, a spin transfer torque memory cell (i.e., STRAM). These magnetic tunnel junction data cells are further described below. Semiconductor fabrication techniques can be utilized to form the resistive sense memory apparatus and arrays described herein.

FIG. 1 is a cross-sectional schematic diagram of an illustrative magnetic tunnel junction data cell 1. The magnetic tunnel junction data cell 1 includes a ferromagnetic free layer 2 and a ferromagnetic reference (i.e., pinned) layer 4. The ferromagnetic free layer 2 and a ferromagnetic reference layer 4 are separated by an oxide barrier layer 3 or tunnel barrier. A first electrode 5 is in electrical contact with the ferromagnetic free layer 2 and a second electrode 6 is in electrical contact with the ferromagnetic reference layer 4. The ferromagnetic layers 2, 4 may be made of any useful ferromagnetic (FM) alloys such as, for example, Fe, Co, Ni and the insulating barrier layer 3 may be made of an electrically insulating material such as, for example an oxide material (e.g., $Al_2O_3$ or MgO). Other suitable materials may also be used.

The electrodes 5, 6 electrically connect the ferromagnetic layers 2, 4 to a control circuit providing read and write currents through the ferromagnetic layers 2, 4. The resistance across the magnetic tunnel junction data cell 1 is determined by the relative orientation of the magnetization vectors or magnetization orientations of the ferromagnetic layers 2, 4. The magnetization direction of the ferromagnetic reference layer 4 is pinned in a predetermined direction while the magnetization direction of the ferromagnetic free layer 2 is free to rotate under the influence of a spin torque. Pinning of the ferromagnetic reference layer 4 may be achieved through, e.g., the use of exchange bias with an antiferromagnetically ordered material such as PtMn, IrMn and others. When the magnetization orientation of the ferromagnetic free layer 2 is parallel and in the same direction of the magnetization orientation of the ferromagnetic reference layer 4 the magnetic tunnel junction is described as being in the low resistance state or "0" data state. When the magnetization orientation of the ferromagnetic free layer 2 is anti-parallel and in the opposite direction of the magnetization orientation of the ferromagnetic reference layer 4 the magnetic tunnel junction is described as being in the high resistance state or "1" data state.

Switching the resistance state and hence the data state of the magnetic tunnel junction data cell 1 via spin-transfer occurs when a current, passing through a magnetic layer of the magnetic tunnel junction data cell 1, becomes spin polarized and imparts a spin torque on the free layer 2 of the magnetic tunnel junction data cell 1. When a sufficient spin torque is applied to the free layer 2, the magnetization orientation of the free layer 2 can be switched between two opposite directions and accordingly the magnetic tunnel junction data cell 1 can be switched between the parallel state (i.e., low resistance state or "0" data state) and anti-parallel state (i.e., high resistance state or "1" data state) depending on the direction of the current.

The illustrative spin-transfer torque magnetic tunnel junction data cell 1 may be used to construct a memory device that includes multiple magnetic tunnel junction data cells in an array where a data bit is stored in magnetic tunnel junction data cell by changing the relative magnetization state of the free magnetic layer 2 with respect to the pinned magnetic layer 4. The stored data bit can be read out by measuring the resistance of the cell which changes with the magnetization direction of the free layer relative to the pinned magnetic layer. In order for the spin-transfer torque magnetic tunnel junction data cell 1 to have the characteristics of a non-volatile random access memory, the free layer exhibits thermal stability against random fluctuations so that the orientation of the free layer is changed only when it is controlled to make such a change.

Figure 2:
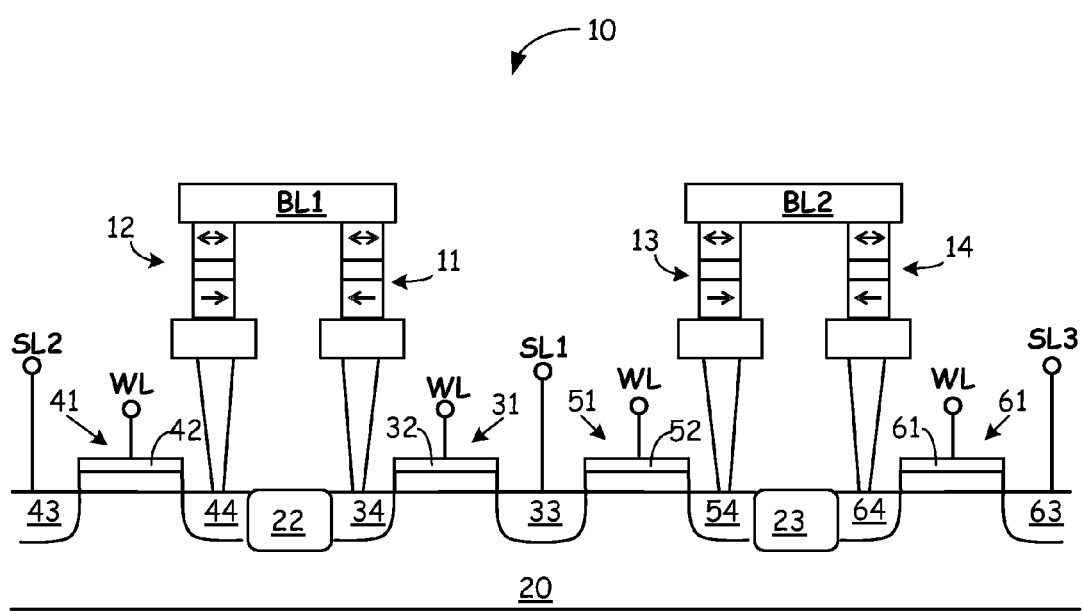
FIG. 2 is a cross-sectional schematic diagram of the illustrative resistive sense memory apparatus.

FIG. 2 is a side elevation schematic diagram of the illustrative resistive sense memory apparatus 10. The illustrative resistive sense memory apparatus 10 is constructed on a semiconductor substrate 20. The illustrative resistive sense memory apparatus 10 can be formed utilizing semiconductor fabrication techniques. The resistive sense memory apparatus 10 includes a first semiconductor transistor 31 having a first contact 33 electrically connected to a first source line SL1 and a second contact 34 electrically connected to a first resistive sense memory element 11. A second semiconductor transistor 41 has a first contact 43 electrically connected to a second source line SL2 and a second contact 44 electrically connected to a second resistive sense memory element 12. The first semiconductor transistor 31 and the second semiconductor transistor 41 are adjacent to each other and are electrically isolated from each other. In many embodiments an electrically insulating region 22 electrically isolated the first semiconductor transistor 31 from the second semiconductor transistor 41.

A bit line BL1 is electrically connected to the first resistive sense memory element 11 and the second resistive sense memory element 12. The bit line BL1 is a shared or common bit line and can span the width of both the first resistive sense memory element 11 and the second resistive sense memory element 12. Thus, the bit line BL1 has a wide width which can reduce the resistivity of the bit line BL1 and improve the scalability of the resistive sense memory apparatus 10.

A third semiconductor transistor 51 can share the first contact 33 electrically connected to the first source line SL1. Thus, the first semiconductor transistor 31 and the third semiconductor transistor 51 share a common source contact region 33. The third semiconductor transistor 51 has a second contact 54 electrically connected to a third resistive sense memory element 13. The third resistive sense memory element 13 is electrically connected to a second bit line BL2.

A fourth semiconductor transistor 61 has a first contact 63 electrically connected to a third source line SL3 and a second contact 64 electrically connected to a forth resistive sense memory element 14. The second bit line BL2 is electrically connected to the third resistive sense memory element 13 and the fourth resistive sense memory element 14. The second bit line BL2 is a shared or common bit line and can span the width of both the third resistive sense memory element 13 and the forth resistive sense memory element 14. Thus, the second bit line BL2 has a wide width which can reduce the resistivity of the second bit line BL2 and improve the scalability of the resistive sense memory apparatus 10. In many embodiments an electrically insulating region 23 electrically isolated the third semiconductor transistor 51 from the fourth semiconductor transistor 61.

The first semiconductor transistor 31 has a gate contact 32 electrically connected to a word line WL. The second semiconductor transistor 41 has a gate contact 42 electrically connected to the word line WL. The third semiconductor transistor 51 has a gate contact 52 electrically connected to the word line WL. The fourth semiconductor transistor 61 has a gate contact 62 electrically connected to the word line WL. The word line is a common word line WL.

The contact regions 33, 34, 43, 44, 54, 63, 64 can be regions of the substrate 20 that are doped with a P or N type dopant material, as desired. The illustrated resistive sense memory apparatus 10 is shown with four semiconductor transistors and four resistive sense memory elements, however the resistive sense memory apparatus can have any number of resistive sense memory elements that form an array.

To access the first resistive sense memory element 11 a drain voltage is applied to the first bit line BL1 and the second source line SL2, while a source voltage is applied to the second bit line BL2 and the first source line SL1. A gate voltage is applied to the word line WL. Adjacent bit line and source lines (e.g., third source line SL3) are allowed to float. This voltage scheme allows access only to the first resistive sense memory element 11 and prevents current passing through sneaky paths.

Figure 3:
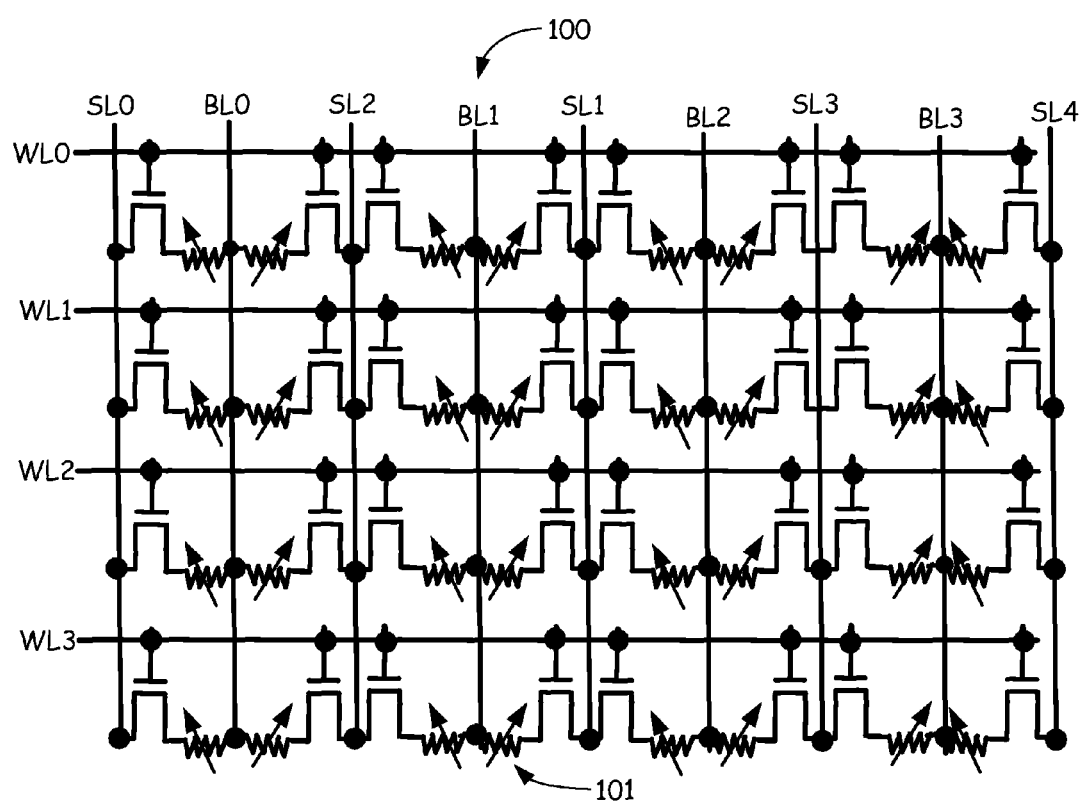
FIG. 3 is a schematic circuit diagram of the illustrative resistive sense memory array.

FIG. 3 is a schematic circuit diagram of the illustrative resistive sense memory array 100. The resistive sense memory array 100 includes 32 resistive sense memory elements with two resistive sense memory elements sharing a bit line (BL0, BL1, BL2, BL3) and 32 semiconductor transistors with two semiconductor transistors sharing a source line (SL0, SL1, SL2, SL3, SL4) and each row of semiconductor transistors sharing a word line (WL0, WL1, WL2, WL3).

To access the resistive sense memory element labeled 101, a source voltage is applied to the bit line BL2 and source line SL1 and a drain voltage is applied to the bit line BL1 and source line SL2. The adjacent bit lines (BL0, BL3) and source lines (SL0, SL3, SL4) can be floating. The word line WL3 has a word line voltage. Thus, current flow is confined to the resistive sense memory element labeled 101. The current can be a read current or a write current, for example.

The shared bit line and source line resistive sense memory array structure described herein can provide an array with higher density and faster access speed than conventional resistive sense memory array structures. In addition, a shared bit line can increase the width of the shared bit line reducing the bit line resistivity and allowing for further scaling of the apparatus.

Thus, embodiments of the SHARED BIT LINE AND SOURCE LINE RESISTIVE SENSE MEMORY STRUCTURE are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A spin transfer torque memory apparatus comprising:
 a first transistor having a first contact electrically connected to a first source line and a second contact electrically connected to a first spin transfer torque memory element;
 a second transistor having a first contact electrically connected to a second source line and a second contact electrically connected to a second spin transfer torque memory element; and
 a bit line electrically connected to the first spin transfer torque memory element and the second spin transfer torque memory element at the same location on the bit line.

2. The spin transfer torque memory apparatus according to claim 1, wherein the first transistor and the second transistor adjacent to each other and electrically isolated from each other.

3. The spin transfer torque memory apparatus according to claim 1, further comprising a third transistor adjacent to the first transistor, the third transistor sharing the first contact electrically connected to the first source line, the third transistor having a second contact electrically connected to a third spin transfer torque memory element.

4. The spin transfer torque memory apparatus according to claim 3, wherein the third transistor and the first transistor have a common source contact region.

5. The spin transfer torque memory apparatus according to claim 1, further comprising a fourth transistor having a first contact electrically connected to a third source line and a second contact electrically connected to a fourth spin transfer torque memory element, a second bit line electrically connected to the third spin transfer torque memory element and the fourth spin transfer torque memory element.

6. The spin transfer torque memory apparatus according to claim 1, wherein the first transistor and second transistor are electrically connected to a common word line.

7. The spin transfer torque memory apparatus according to claim 1, wherein the first spin transfer torque memory element and the second spin transfer torque memory element are memory elements of a memory array.

8. The spin transfer torque memory apparatus according to claim 5, wherein the first transistor, second transistor, third transistor, and fourth transistor are electrically connected to a common word line.

9. A spin transfer torque memory apparatus comprising:
 a first transistor having a first contact electrically connected to a first source line and a second contact electrically connected to a first spin transfer torque memory element;
 a second transistor having a first contact electrically connected to a second source line and a second contact electrically connected to a second spin transfer torque memory element;
 a bit line electrically connected to the first spin transfer torque memory element and the second spin transfer torque memory element at the same location on the bit line; and
 a third transistor sharing the first contact electrically connected to the first source line at the first contact location, the third transistor having a second contact electrically connected to a third spin transfer torque memory element, and the third resistive spin transfer torque element electrically connected to a second bit line.

10. The spin transfer torque memory apparatus according to claim 9, further comprising a fourth transistor having a first contact electrically connected to a third source line and a second contact electrically connected to a forth spin transfer torque memory element, the second bit line electrically connected to the third spin transfer torque memory element and the fourth spin transfer torque memory element.

11. The spin transfer torque memory apparatus according to claim 10, wherein the first transistor and the second transistor are adjacent to each other and electrically isolated from each other and the third transistor and the fourth transistor are adjacent to each other and electrically isolated from each other.

12. The spin transfer torque memory apparatus according to claim 9, wherein the first transistor and second transistor are electrically connected to a common word line.

13. The spin transfer torque memory apparatus according to claim 9, wherein the first spin transfer torque memory element and the second spin transfer torque memory element are memory elements of a memory array.

14. The spin transfer torque memory apparatus according to claim 10, wherein the first transistor, second transistor, third transistor, and fourth transistor are electrically connected to a common word line.

15. A method of accessing a spin transfer torque memory cell in a memory array comprising:
   providing a spin transfer torque memory array comprising:
      a first transistor having a first contact electrically connected to a first source line and a second contact electrically connected to a first spin transfer torque memory element;
      a second transistor having a first contact electrically connected to a second source line and a second contact electrically connected to a second spin transfer torque memory element;
      a bit line electrically connected to the first spin transfer torque memory element and the second spin transfer torque memory element at the same location on the bit line; and
      a third transistor sharing the first contact electrically connected to the first source line at the first contact location, the third transistor having a second contact electrically connected to a third spin transfer torque memory element, and the third spin transfer torque memory element electrically connected to a second bit line;
   applying a source voltage to the first source line and the second bit line;
   applying a drain voltage to the first bit line and second source line; and
   applying a gate voltage to the first transistor, second transistor and third transistor to flow current through the first spin transfer torque memory element.

16. The method according to claim 15, wherein the current is a read current.

17. The method according to claim 15, wherein the current is a write current.

18. The method according to claim 15, wherein source lines adjacent to the first source line and second source line are floating.

19. The method according to claim 15, wherein bit lines adjacent to the first bit line and second bit line are floating.

20. The method according to claim 15, wherein the first transistor, second transistor, third transistor are electrically connected to a common word line and the gate voltage is applied to the word line.

* * * * *